(12) United States Patent
Wang et al.

(10) Patent No.: US 11,394,385 B1
(45) Date of Patent: Jul. 19, 2022

(54) INPUT DEVICE HAVING ADJUSTABLE INPUT MECHANISMS

(71) Applicant: Apple Inc., Cupertino, CA (US)

(72) Inventors: Paul X. Wang, Cupertino, CA (US);
John C. DiFonzo, Cupertino, CA (US);
Dayu Qu, Cupertino, CA (US); Zheng Gao, Cupertino, CA (US); Chang Zhang, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 15/422,404

(22) Filed: Feb. 1, 2017

Related U.S. Application Data

(60) Provisional application No. 62/396,981, filed on Sep. 20, 2016.

(51) Int. Cl.
| | |
|---|---|
| *G06F 3/01* | (2006.01) |
| *G06F 3/02* | (2006.01) |
| *H03K 17/97* | (2006.01) |
| *H03K 17/972* | (2006.01) |

(52) U.S. Cl.
CPC ........... *H03K 17/972* (2013.01); *G06F 3/016* (2013.01); *G06F 3/0202* (2013.01); *H03K 2017/9713* (2013.01)

(58) Field of Classification Search
CPC ...... H03K 19/072; G06F 3/016; G06F 3/0202
USPC ............................ 400/481, 490; 341/22, 32
See application file for complete search history.

(56) References Cited

U.S. PATENT DOCUMENTS

| | | | | |
|---|---|---|---|---|
| 4,212,473 | A * | 7/1980 | Arai | F01C 19/08 |
| | | | | 277/357 |
| 5,220,318 | A * | 6/1993 | Staley | B41J 5/26 |
| | | | | 341/34 |
| 6,441,571 | B1 * | 8/2002 | Ibuki | H02P 25/032 |
| | | | | 30/277.4 |
| 6,700,508 | B1 * | 3/2004 | Nomura | H01H 13/702 |
| | | | | 341/27 |
| 6,962,452 | B2 | 11/2005 | Cheng | |
| 7,170,428 | B2 * | 1/2007 | Himberg | G06F 3/016 |
| | | | | 340/407.2 |
| 7,567,232 | B2 * | 7/2009 | Rosenberg | G06F 3/016 |
| | | | | 345/156 |
| 7,667,623 | B2 | 3/2010 | Soh et al. | |
| 8,232,494 | B2 | 7/2012 | Purcocks | |
| 9,607,491 | B1 * | 3/2017 | Mortimer | G08B 6/00 |
| 10,592,009 | B2 * | 3/2020 | Rizvi | G06F 3/03543 |
| 2002/0067336 | A1 * | 6/2002 | Wegmuller | G06F 3/016 |
| | | | | 345/156 |
| 2006/0261983 | A1 * | 11/2006 | Griffin | H01H 13/84 |
| | | | | 341/27 |
| 2008/0018592 | A1 * | 1/2008 | Park | A63F 13/06 |
| | | | | 345/156 |
| 2013/0233685 | A1 * | 9/2013 | Zhang | H01H 13/85 |
| | | | | 200/344 |

(Continued)

OTHER PUBLICATIONS

Savioz et al, Toward multi-finger haptic devices: a computer keyboard with adjustable force feedback. (Year: 2002).*

*Primary Examiner* — Albert K Wong
(74) *Attorney, Agent, or Firm* — Dorsey & Whitney LLP

(57) ABSTRACT

Disclosed herein is an input device having adjustable input mechanisms. The input mechanisms of the input device may be dynamically adjusted based on one or more input characteristics associated with a user. Accordingly, the input device may be customized to fit a user's input preferences.

15 Claims, 14 Drawing Sheets

(56) References Cited

U.S. PATENT DOCUMENTS

2015/0302966 A1* 10/2015 Soelberg .............. A63F 13/42
                                                463/37
2016/0379776 A1* 12/2016 Oakley ................ H01H 13/84
                                                200/5 A

* cited by examiner

INPUT DEVICE HAVING ADJUSTABLE INPUT MECHANISMS

FIELD

The described embodiments relate generally to an input device. More specifically, the embodiments described herein are directed to an input device having adjustable input mechanisms. Each of the adjustable input mechanisms of the input device may be automatically adjusted or otherwise tuned based on a user preference.

BACKGROUND

Conventional input devices, such as keyboards, are typically static. As such, a user cannot adjust the feel and/or travel of a translatable input mechanism of the input device (such as a key or button). Typically, different users have different typing preferences based on their hand size, gender, typing style and so on. However, because the feel and/or travel of the translatable input mechanism of the input device is static, the user may have to settle for an input device that does not match his typing preferences.

SUMMARY

Disclosed herein is an input device having adjustable input mechanisms. In some embodiments, the input device is a keyboard and the input mechanisms may be the various individual keys of the keyboard. In other embodiments, the input device may be a controller (e.g., a game controller), a remote (e.g., a remote control) a keypad of a telephone, a calculator and so on. In these examples, the input mechanisms may be one or more buttons on the controller, the remote, the telephone, the calculator and so on. Although specific examples have been given, the embodiments described herein may be used with various other electronic or mechanical devices that include one or more translatable input mechanisms. In each case, the travel distance, feel and force profile of the input mechanisms of the input device may be customized to fit a user's input preferences.

In one implementation, the input device includes an input mechanism operative to move from a first position to a second position in response to a received input. A first magnetic component is coupled to the input mechanism and a second magnetic component is spaced apart from the first magnetic component. The input device also includes a coil that is operative to change a magnetic force of the second magnetic component in response to a received signal.

Also disclosed herein is an input mechanism having an input surface, a first magnet, and a second magnet. The first magnet is connected to the input surface and the second magnet interacts with the first magnet to dynamically alter a travel profile of the input mechanism. The travel profile of the input mechanism is used to control generation of an input signal.

The present disclosure also describes a method for adjusting a travel profile of an input mechanism of input device. This method includes determining an input characteristic associated with the input mechanism, and changing a magnetic property of a magnetic component associated with the input mechanism. In some embodiments, the change in the magnetic property is based, at least in part, on the input characteristic.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
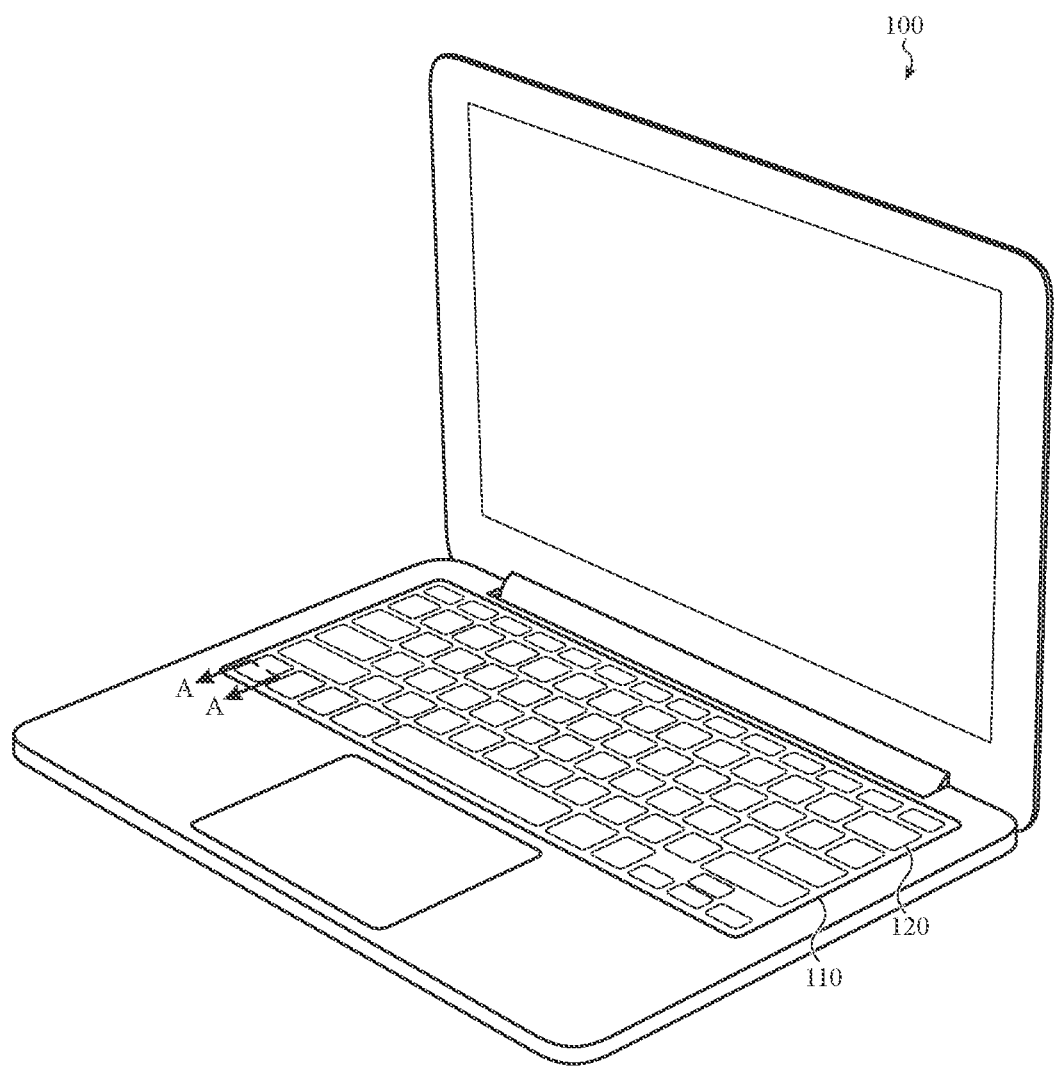
FIG. 1 illustrates an example electronic device that may use or incorporate an adjustable input device such as described herein.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

Embodiments described herein are directed to an input device having adjustable input mechanisms. As one example, the input device may be a keyboard. When the input device is a keyboard, each individual key of the keyboard (or certain keys of the keyboard) may be dynamically adjusted based on user preference. More specifically, the travel distance of a key may be dynamically adjusted based on user preferences. Likewise, a tactile or haptic feel or output of the individual keys may also be dynamically adjusted. The amount of force required to actuate the key may also be dynamically adjusted. Although a keyboard is specifically mentioned, the embodiments described herein may be used with a variety of input devices and/or input mechanisms. For example, the input mechanism may be a button on a mobile phone or other electronic device. In other examples, the input mechanisms may be one or more buttons on a remote control device, a calculator, or any other electronic or mechanical device having a translatable input mechanism.

The input device of the present disclosure may include a sensor that determines one or more input characteristics associated with a user of the input device. In one example, the sensor may be a light sensor that measures a change in detected light as the user moves his fingers and hands over the input device. This information may be used to determine the relative hand and/or finger size of a user and/or preferred hand/finger placement on the input device. In another implementation, the sensor may be a capacitive sensor that measures a change in capacitance between a user's fingers and/or hands and the input mechanisms of the input device. The amount of change in capacitance may also indicate the position of the user's fingers on the input mechanisms and/or the relative size of the user's hands or fingers. In yet another implementation, the sensor may also be a force sensor that measures a magnitude of force applied to the various input mechanisms of the input device. In some embodiments, an input signal provided by the input mechanism when it is actuated may be used to determine the speed at which the user is providing input.

Once this information is collected, it may be analyzed to determine various settings for the input device. For example, in one implementation and based on the analyzed data, the height of one or more of the input mechanisms may be automatically adjusted. In another example, an amount of force required to actuate the input mechanism may be automatically adjusted.

In order to effect the changes described above, each input mechanism of the input device may include one or more magnetic components. More specifically, in one implementation, a first magnetic component is coupled to or is otherwise associated with an input mechanism of the input device while a second magnetic component is positioned beneath and/or adjacent the first magnetic component. A coil may surround or otherwise be adjacent to the second magnetic component. When a current in a first direction is applied to the coil, an attractive magnetic force between the first magnetic component and the second magnetic component increases. When a current in a second direction is applied to the coil, a repulsive magnetic force between the first magnetic component and the second magnetic component increases. Accordingly, the force of the input mechanism may be tuned or may otherwise be changed in a precise manner. In addition, the height of the input mechanism may change which changes the amount of travel of the input mechanism.

The input mechanism may include also include a switch that initiates an input signal when the input mechanism is actuated. In some embodiments, the switch may be omitted and a sensor may be used to determine when the input mechanism is actuated. For example, the input mechanism may include a Hall effect sensor or a magnetometer that detects or otherwise determines a position or movement of the first magnetic component relative to the second magnetic component thereby indicating the input mechanism has been actuated. Although specific examples have been given, actuation of the input mechanism may be determined in a number of different ways.

These and other embodiments are discussed below with reference to FIGS. 1-11. However, those skilled in the art will readily appreciate that the detailed description given herein with respect to these Figures is for explanatory purposes only and should not be construed as limiting.

FIG. 1 illustrates an example electronic device 100 that may use or otherwise incorporate an input device 110. The input device 110 may have a number of different input mechanisms 120 that provide different input to the electronic device 100.

As shown in FIG. 1, the example electronic device 100 may be a laptop computer. As such, the input device 110 may be a keyboard and the input mechanism 120 may be a key of the keyboard. Although a laptop computer with a keyboard is specifically shown and described, the electronic device 100 may be any type of electronic device including, but not limited to, a desktop computer, a tablet computing device, a smartphone, a gaming device, a digital music player, a wearable computing device, a health monitoring device, and so on. Likewise, while a keyboard is specifically mentioned, the input device 110 may be any type of input device having a translatable input mechanism. For example, the input mechanism 120 may be a key, a button, a switch, and so on.

As will be described herein, a configuration of each input mechanism 120 of the input device 110 may be dynamically adjusted based on one or more input characteristics. In some implementations, the input characteristics may be associated with a user. Accordingly, a sensor associated with the input device 110 and/or the input mechanism 120 may detect one or more of these input characteristics.

In some embodiments, the sensor may determine one or more input characteristics or typing characteristics of a user that is using the input device 110. For example, the sensor may determine a size of the user's hands or fingers, the position of the user's hands or fingers on the input device 110, a magnitude of force provided on each input mechanism 120 and so on. Although a sensor is specifically mentioned, other components associated with the input device 110 may determine one or more input characteristics of the user. For example, a processing unit associated with the input device 110 may detect the speed at which the user provides input.

Once one or more of these input characteristics are determined, a position (e.g., the height), and thus the travel distance, of each input mechanism 120 may be dynamically adjusted. In addition, the amount of force required to actuate the input mechanism 120 may also be dynamically adjusted.

Changing a height of the input mechanism may provide additional functionality and/or characteristics for the associated electronic device. For example, the keys of a keyboard (or other buttons) on a laptop computer may be retracted to be flush with, or even recessed into, a keyweb or other structure defined by the housing of the laptop computer. This may reduce the overall thickness of the laptop computer, for example when it is closed. In some embodiments, closing a laptop (for example, by rotating a portion of the laptop about a hinged connector) may automatically cause the keys to retract, as may putting the laptop to sleep or otherwise powering off, or any other change in operational state. When the laptop is opened, powered on, woken, or the like, the keys may return to a default height/position.

In some implementations, the detected input characteristics may be compared against an input characteristic database. The input characteristic database may contain information about input preferences from various individual users. For example, the information in the input characteristic database may indicate that a first subset of users with a particular hand size typically provide input with a first amount of force. As such, a first input device configuration having a first force profile may be selected for the input device. Likewise, the input characteristic database may also indicate that at second subset of users with a smaller hand size typically provide input with a second amount of force. Accordingly, a second input device configuration having a second force profile may be selected for the input device. In other examples, the information in the input characteristic database may indicate that users that are able to quickly provide input (e.g., fast typists) prefer their input mechanisms to have smaller travel distances than users that provide input more slowly. Accordingly, a third input device configuration with low travel input mechanisms may be selected for the input device.

When the input device configuration is determined, the input mechanisms 120 of the input device may be dynamically adjusted. In other embodiments, each individual user may program the input device 110, and/or each individual input mechanism 120, to have user-selected configurations. In some implementations, the input device may adjust its configuration over time. For example, as a user gets more familiar with the input device 110, her input preferences may change. In such situations, the input device 110 may dynamically change its configuration to coincide with the user's change in preference.

Figure 2A:
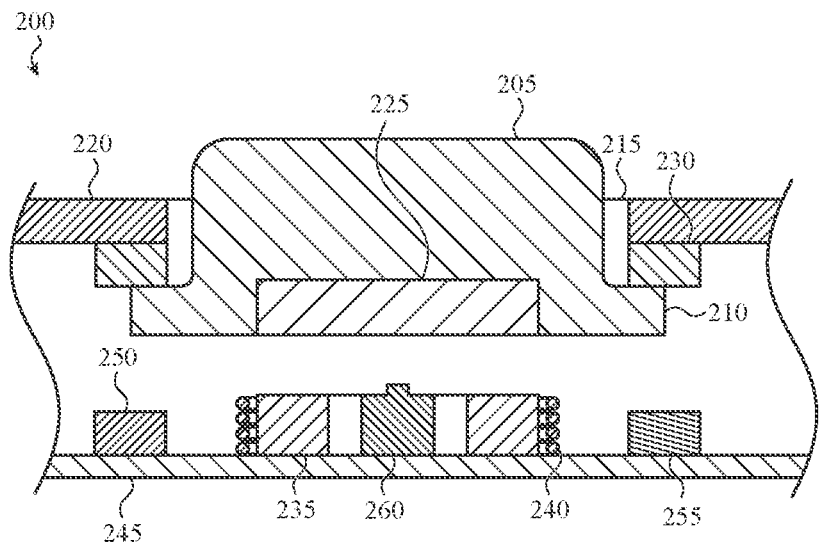
FIG. 2A illustrates a sample cross-section view of an input mechanism of an adjustable input device in a first position according to a first embodiment.

FIG. 2A shows a cross-section view of an input mechanism 200 taken along line A-A of FIG. 1. The input mechanism 200 may include an input surface. As used herein, an "input surface" may be a structure configured for a user to contact in order to provide or otherwise initiate an input. Some input surfaces may include keycaps, track pad surfaces, an exterior of a mouse, touch-sensitive surfaces and/or force-sensitive surfaces, displays, and the like. In the embodiments illustrated in FIG. 2A, the input surface is shown as a keycap 205. The keycap 205 may have a generally rectangular shape although this is not required. In some implementations, the keycap 205 may be square, circular, or have any other shape. The keycap 205 may include a flange 210 that extends from a bottom portion of the keycap 205.

The keycap 205 is positioned within an aperture 215 defined by an enclosure 220. The enclosure 220 may be adjacent to or may at least partially surround the keycap 205. The flange 210 may be disposed underneath the enclosure 220 of the input mechanism 200. The flange 210 may act to secure the keycap 205 within the enclosure 220. For example, the flange 210 may abut or otherwise come into contact with an underside of the enclosure 220 when the keycap 205 is in a first position and may be separated or otherwise spaced apart from the underside of the enclosure 220 when it is in a second position.

In some embodiments, and in order to minimize damage or stress to the keycap 205, a compliant member 230 may be positioned on an underside of the enclosure 220. The compliant member 230 may serve to protect the keycap 205 from damage as the keycap 205 may repeatedly come into contact with the underside of the enclosure 220 as it is actuated and subsequently released. In some embodiments and as will be described below, the input mechanism 200 may provide a haptic output. The compliant member 230 may be used to eliminate or minimize any damage that may occur to the keycap 205 as a result of the haptic output. The compliant member 230 may also serve to secure or otherwise maintain the keycap 205 within the enclosure 220.

The input mechanism 200 may also include a first magnetic component 225 and a second magnetic component 235. The first magnetic component 225 and the second magnetic component interact with one another to change a travel profile of the input mechanism 200 and also interact with one another to produce a haptic output.

The first magnetic component 225 may be positioned within or adjacent the keycap 205. The second magnetic component 235 may be positioned beneath the keycap 205 and the first magnetic component 225. The second magnetic component 235 may also be spaced apart from the first magnetic component 225. In some embodiments, the second magnetic component 235 is a hollow disc magnet or otherwise has an annular shape. In some embodiments, the first magnetic component 225 may have a protrusion or other portion that is received within the hollow portion of the second magnetic component 235 as the magnetic components move closer together (e.g., in response to an input force). In other embodiments, each of the first magnetic component 225 and the second magnetic component 235 may have any shape or configuration. In some embodiments, the first magnetic component 225 and the second magnetic component 235 may be comprised of ferromagnetic materials such as, for example, iron, steel, aluminum nickel cobalt, and so on.

Figure 2B:
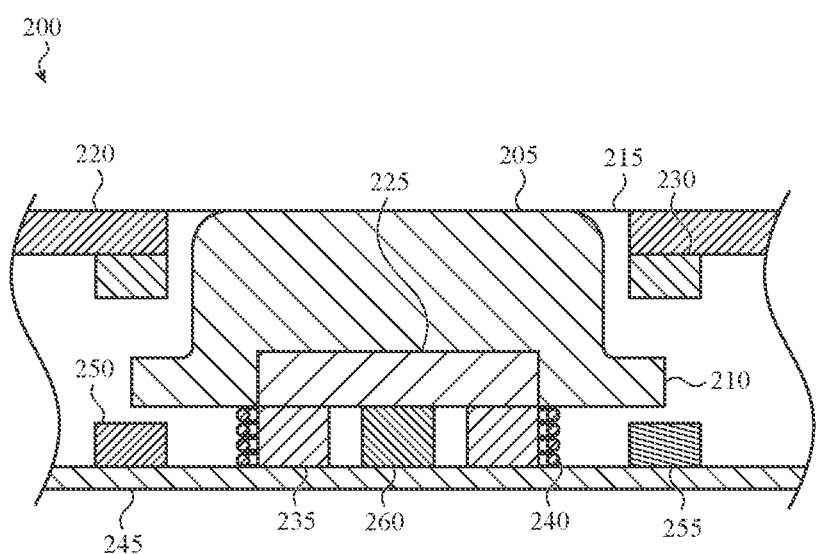
FIG. 2B illustrates a sample cross-section view of the input mechanism of FIG. 2A in a second position.

The first magnetic component 225 may have a polarity that opposes the polarity of the second magnetic component 235. As such, the keycap 205 may be maintained in its nominal position such as shown in FIG. 2A. However, when a force is applied to a top surface of the keycap 205, the keycap 205 may be depressed (such as shown in FIG. 2B). Once the force is removed from the top surface of the keycap 205, a repulsive magnetic force between the first magnetic component 225 and the second magnetic component 235 causes the keycap 205 to return to its nominal state.

Keycaps 205 (or other input mechanisms) may be retracted by operating coil 240 with a high current in order to pull the key fully down such that it abuts the magnetic material 235. In some embodiments, the magnetic material 235 may be magnetized by operation of the coil 240, so that the key is held in its retracted position even if no current flows through the coil. Current may be reversed through the coil 240 in order to change the polarity of the magnetic material 235, thereby freeing the key from its retracted position as generally described above. As discussed elsewhere herein, the strength of the magnetic field may be varied by adjusting the degree of magnetization of the magnetic material 235, for example by varying the amount of current through the coil 240, the length of time the coil 240 is energized, and so on.

In some embodiments, the compliant member 230 may be comprised of or otherwise include a magnetic component.

As such, the compliant member 230 may exert an attractive magnetic force on the first magnetic component 225 in order to help return the keycap 205 to its nominal position.

In some embodiments, the degree or force of repulsion between the first magnetic component 225 and the second magnetic component 235 may be dynamically adjusted. As such, the nominal position and/or the height of the keycap 205 may be dynamically adjusted. Likewise, an amount of force required to actuate the input mechanism 200 may also be dynamically adjusted. For example, as the degree or force of repulsion between the first magnetic component 225 and the second magnetic component 235 increases, the amount of force required to actuate the input mechanism 200 also increases.

The input mechanism 200 includes a coil 240. The coil 240 may surround or otherwise be associated with the second magnetic component 235. As such, the coil 240 may set the magnetic profile of the second magnetic component 235. For example, when a current in a first direction is applied to the coil 240, the degree or force of repulsion between the first magnetic component 225 and the second magnetic component 235 may change. As the repulsion between the first magnetic component 225 and the second magnetic component 235 changes, the position of the keycap 205 may also change. As a result, a travel profile of the input mechanism 200 may be dynamically adjusted.

For example, the travel profile of the input mechanism 200 may include a travel distance of the input mechanism 200 and an amount of force required to actuate the input mechanism 200. Thus, as the repulsion between the first magnetic component 225 and the second magnetic component 235 changes, the travel distance and/or the amount of force required to actuate the input mechanism 200 and generate an input signal, may dynamically change. In some embodiments, the travel distance may include a continuous range of travel distances. Likewise, the amount of force required to actuate the input mechanism 200 may be a continuous range of force values.

In other implementations, the coil 240 may change the degree or force of attraction between the first magnetic component 225 and the second magnetic component 235. For example, when a current in a second direction is applied to the coil 240, the degree or force of attraction between the first magnetic component 225 and the second magnetic component 235 may increase. As such, the position of the keycap 205, and the amount of force required to actuate the input mechanism 200, may also change accordingly.

The input mechanism 200 may include a drive circuit 250. The drive circuit 250 may be positioned on a circuit board 245 of the input mechanism 200 and provide the directional current to the coil 240. Once the coil 240 is energized, the coil 240 may alter the magnetic properties of the second magnetic component 235 such as described above.

In some embodiments, the coil 240 may cause a change in the polarity of the second magnetic component 235. As such, the second magnetic component 235 may attract the first magnetic component 225. In other embodiments, the current provided by the drive circuit 250 may cause the coil 240 to generate an attractive force that at least partially overcomes the repulsive force between the first magnetic component 225 and the second magnetic component 235.

The coil 240 may also be used to produce a haptic output for the input mechanism 200. For example, the drive circuit 250 may provide a pulse to the coil 240. The pulse may cause the keycap 205 to move quickly in a particular direction (e.g., upward or downward) as the magnetic repulsion (or attraction) between the first magnetic component 225 and the second magnetic component 235 changes. In some implementations, the haptic output may simulate a click sensation.

In other implementations, the pulse provided by the drive circuit 250 may be shaped to cause the first magnetic component 225 and the second magnetic component 235 to produce a vibration. For example, the pulse provided by the drive circuit 250 may cause alternating repulsive and attractive forces between the first magnetic component 225 and the second magnetic component 235.

Figure 7A:
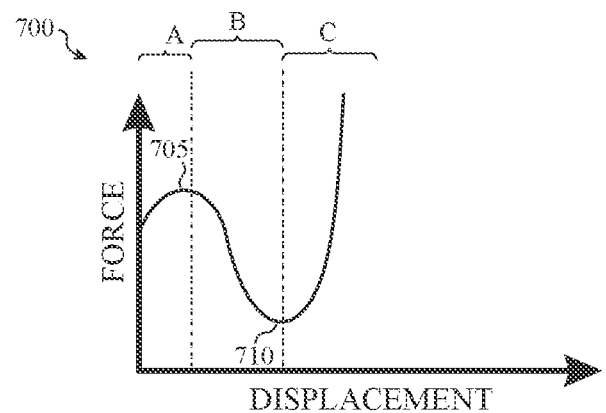
FIG. 7A illustrates a first example force displacement curve of the input mechanism described herein.
Figure 7B:
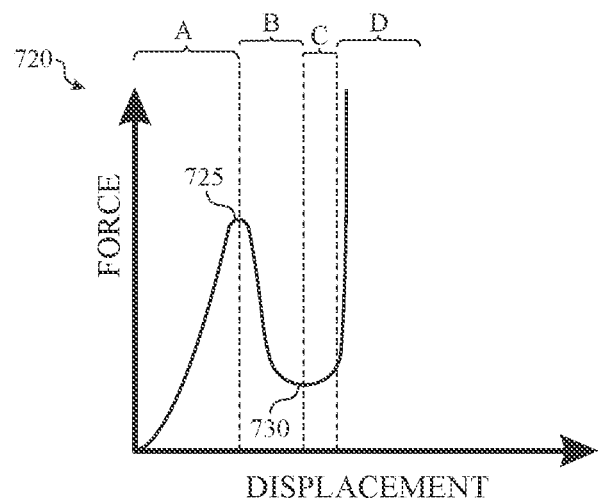
FIG. 7B illustrates a second example force displacement curve of the input mechanism described herein.
Figure 7C:
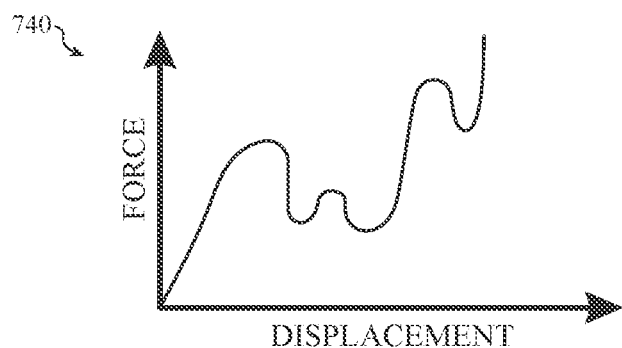
FIG. 7C illustrates a third example force displacement curve of the input mechanism described herein.

In some embodiments, the haptic output may be a reduction or an increase in a force curve between the first magnetic component 225 and the second magnetic component 235. As such, the haptic output provided by the input mechanism 200 may have a variety of force displacement curves that provide a variety of force to click profiles such as shown in FIGS. 7A—7C. As such, the input mechanism 200 of the present disclosure may have a continuous range of force input profiles and associated click ratios instead of binary force click ratios present in conventional input mechanisms.

The input mechanism 200 may also include a sensor 255. The sensor 255 may determine one or more input characteristics associated with the user of the input mechanism 200. The input characteristics may be the amount of force provided on the input mechanism 200, the size of a user's hands and/or fingers and so on. For example, and as briefly described above, the sensor 255 may be a capacitive sensor that detects a change in capacitance between a user's fingers and/or hands and the keycap 205. The amount of the change in capacitance may indicate the position of the user's finger on a particular input mechanism 200 and/or the relative size of the user's hands and/or fingers. The sensor 255 may also be a force sensor that measures a magnitude of force applied to keycap 205. Although specific sensors are mentioned, various other types of sensors may be used including, but not limited to, optical sensors, motion sensors, magnetic sensors, Hall effect sensors, Anisotropic Magneto-Resistive sensors, tunnel magnetoresistance sensors and so on.

In addition to determining the various input characteristics of the user, the sensor 255 may be used to detect when the input mechanism 200 has been actuated. For example, the sensor 255 may be a Hall effect sensor that detects or otherwise determines a position or movement of the first magnetic component 225 relative to the second magnetic component 235 thereby indicating the input mechanism 200 has been actuated.

In some embodiments, when the sensor 255 determines that the keycap 205 of the input mechanism 200 has traveled a certain distance, the sensor 255 may provide that information to the drive circuit 250 (via a processing unit). The drive circuit 250 may then provide a current to the coil 240, which subsequently provides haptic output in the manner described above.

In some embodiments, the input mechanism 200 may include a switch 260. The switch 260 may be coupled to the circuit board 245 and may have a contact that is actuated by a portion of the keycap 205. When actuated, the switch 260 initiates an input signal that indicates the input mechanism 200 has been actuated. When the switch 260 has been actuated, the drive circuit 250 may provide a current to coil 240 in the manner described above to provide a haptic output. Although FIG. 2A shows the switch 260 positioned within the second magnetic component 235, this is for illustrative purposes only. The switch 260 may be positioned at various locations within the input mechanism 200 or it may be omitted.

Once the input characteristics have been determined, the force to click ratio of the input mechanism 200 may be dynamically adjusted. In some embodiments, the user may be able to select a desired force to click ratio for each individual input mechanism 200 or for the input device as a whole. In other embodiments, the force to click ratio of the input device or the individual input mechanisms 200 may be adjusted based on one or more predefined settings. For example, the input device (or the electronic device that uses or incorporates the input device) may access a database of stored input device configurations and/or settings. The stored input device configurations or settings may be based on various input characteristics. Thus, when a user's input characteristics match or otherwise correspond to a stored input device configuration, the input device of the user, or individual input mechanisms 200 of the input device, may be automatically adjusted to have the determined configuration.

In some embodiments, each input mechanism 200 of the input device may be independently adjustable and/or controllable. In one example, the drive circuit 250 may provide a pulse that energizes the coil 240 such that the first magnetic component 225 and the second magnetic component 235 provide a repulsive force that causes the keycap 205 to move rapidly upward or downward to provide a haptic output to a user. For example, if the input device is a keyboard of a computing device and a processor of the computing device determines that the user misspells a word, a haptic output, such as a vibration, may be provided on the key that was the cause of the misspelled word.

In still yet other examples, each input mechanism 200 may be configured to move from its nominal state (such as shown in FIG. 2A) to a second state (such as shown in FIG. 2B) based on the operating state of the electronic device. For example, when the electronic device is powered off, in a sleep state or, in the case of a laptop computer, when the cover is moved from an open position to a closed position, the drive circuit 250 may cause the coil 240 to be charged such that the polarity of the second magnetic component 235 changes.

Due to the attractive magnetic force between the first magnetic component 225 and the second magnetic component 235, the top of the keycap 205 moves from a first state, in which the keycap 205 extends beyond the enclosure 220, to a second state, in which the top surface of the keycap 205 is flush, substantially flush or recessed with respect to the enclosure 220. In this particular embodiment, because the polarity of the second magnetic component 235 is changed, additional power is not consumed in order to keep the input mechanisms 200 in the second state.

When the electronic device exits the sleep state (or when any other operational state changes), or when the cover is moved from the closed position to the open position, the drive circuit 250 may provide a directional current to the coil 240 that causes the second magnetic component 235 to exert a repulsive magnetic force on the first magnetic component 225. As such, the keycap 205 may return to its nominal position.

In the example embodiments described above, the input mechanisms 200 may be configured to effectively "float" in place. For example, the first magnetic component 225 and the second magnetic component 235 may provide a sufficient magnetic force to keep the input mechanism 200 at a particular position. As such, the enclosure 220 that surrounds the input mechanism 200 may be reduced or eliminated. Reducing or eliminating the enclosure 220 may enable a thickness and/or a width of the computing device to be substantially reduced.

Figure 3:
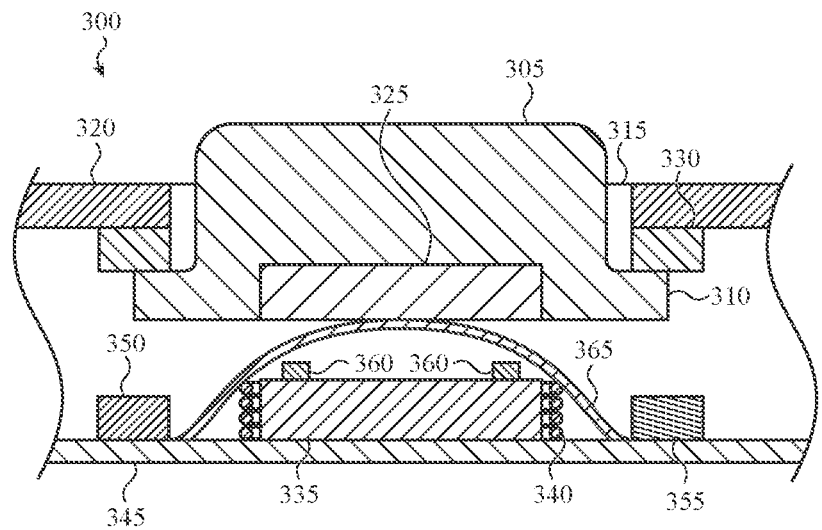
FIG. 3 illustrates a sample cross-section view of an input mechanism of the adjustable input device according to a second embodiment.

FIG. 3 shows a cross-section view of an input mechanism 300 of an input device according to a second embodiment. The cross-section view of the input mechanism 300 may be taken along line A-A of FIG. 1. Like the input mechanism 200 of FIG. 2A, the input mechanism 300 may include an input surface, such as, for example, a keycap 305. The keycap 205 may include a flange 310. The keycap 305 may also be positioned within an aperture 315 defined by an enclosure 320.

The input mechanism 300 also includes a compliant member 330, a first magnetic component 325, a second magnetic component 335, a coil 340, a drive circuit 350 coupled to a circuit board 345, a sensor 355 and one or more switches 360. Each of these components may function in a similar manner as described above.

However, in this particular implementation, a current provided by the drive circuit 350 may cause an attractive magnetic force between the first magnetic component 325 and the second magnetic component 335 to increase thereby reducing the amount of force required to actuate the input mechanism 300. As the keycap 305 is actuated, a spring mechanism 365 positioned between the first magnetic component 325 and the second magnetic component 335 buckles or is otherwise actuated. Buckling of the spring mechanism 365 may provide a haptic output to the user. After the input mechanism 300 is actuated, the current may be removed from the coil 340. Once the current is removed, the attractive force between the first magnetic component 325 and the second magnetic component 335 is reduced, and the spring mechanism 365 causes the keycap 305 to move back to its nominal position.

In some embodiments, and as shown in FIG. 3, the spring mechanism 365 is a dome mechanism. The dome mechanism may be made of rubber, plastic, metal, or a combination thereof. In other implementations, the spring mechanism 365 may have one or more hinges. For example, the spring mechanism 365 may be a scissor mechanism, a butterfly mechanism, and so on.

Figure 4:
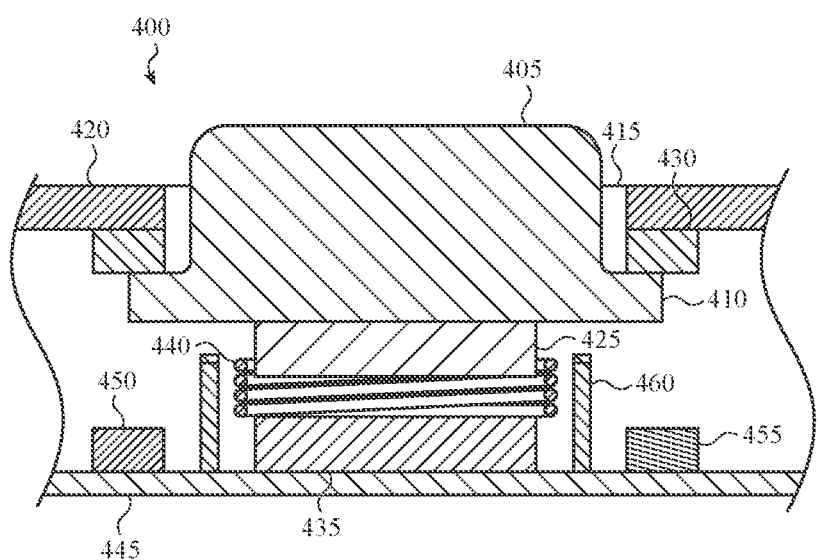
FIG. 4 illustrates a sample cross-section view of an input mechanism of the adjustable input device according to a third embodiment.

FIG. 4 shows a cross-section view of an input mechanism 400 of an input device according to a third embodiment. The cross-section view of the input mechanism 400 may be taken along line A-A of FIG. 1. The input mechanism 400 may include an input surface, such as, for example, a keycap 405, positioned within an aperture 415 defined by an enclosure 420. The keycap 405 may include a flange 410 that extends from a bottom portion.

The input mechanism 400 also includes a compliant member 430, a first magnetic component 425, a second magnetic component 435, a coil 440 at least partially surrounding or otherwise adjacent the first magnetic component 425, a drive circuit 450 coupled to a circuit board 445, a sensor 455 and one or more switches 460. Each of these components may function in a similar manner as described above.

However, in this embodiment, the first magnetic component 425 extends from a bottom surface of the keycap 405. When the drive circuit 450 applies a current to the coil 440, a magnetic field moves the first magnetic component 425 toward the second magnetic component 435. When the current is removed from the coil 440, a repulsive magnetic force between the second magnetic component 435 and the first magnetic component 425 causes the keycap 405 to move back to its nominal position.

Figure 5:
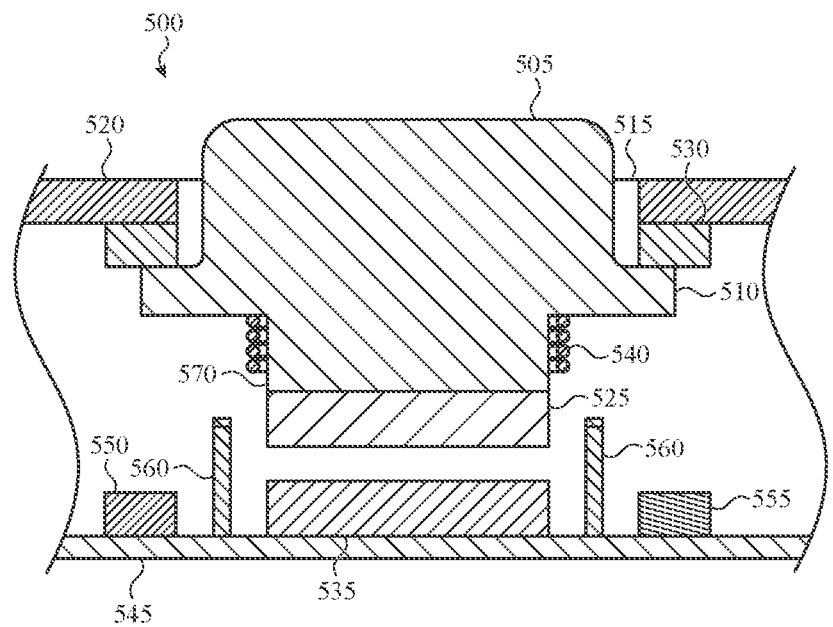
FIG. 5 illustrates a sample cross-section view of an input mechanism of the adjustable input device according to a fourth embodiment.

FIG. 5 shows a cross-section view of an input mechanism 500 of an input device according to a fourth embodiment. The cross-section view of the input mechanism 500 may be taken along line A-A of FIG. 1. The input mechanism 500 may include an input surface, such as, a keycap 505, positioned within an aperture 515 defined by an enclosure 520. The keycap 505 may include a flange 510 such as described above.

The input mechanism 500 may also include a compliant member 530, a first magnetic component 525, a second magnetic component 535, a coil 540 at least partially surrounding or otherwise adjacent a bottom portion of the keycap 505 but positioned above the first magnetic component 425. The input mechanism 500 also includes a drive circuit 550 coupled to a circuit board 545, a sensor 555 and one or more switches 560. Each of these components may function in a similar manner as described above.

As with the embodiment described in FIG. 4, when the drive circuit 550 applies a current to the coil 540, a magnetic field moves the first magnetic component 525 toward the second magnetic component 535. In some embodiments, and as with the other embodiments described herein, an increase in the current adjusts a force curve between the magnetic components. When the current is removed from the coil 540, a repulsive force between the second magnetic component 535 and the first magnetic component 525 causes the keycap 505 to move back to its nominal position.

Figure 6:
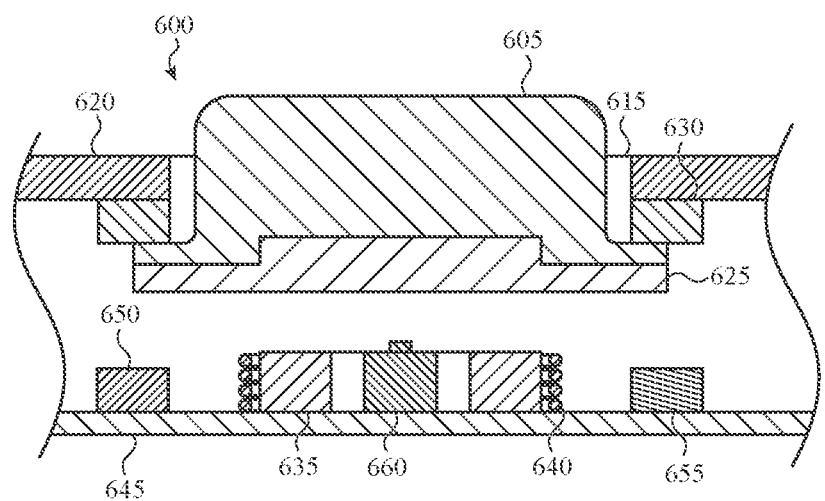
FIG. 6 illustrates a sample cross-section view of an input mechanism of the adjustable input device according to a fifth embodiment.

FIG. 6 shows a cross-section view of an input mechanism 600 of an input device according to a fifth embodiment. The cross-section view of the input mechanism 600 may be taken along line A-A of FIG. 1 and may include similar components to the input mechanism 200 described above with respect to FIG. 2A. For example, the input mechanism 600 may include an input surface, such as, for example, a keycap 605, positioned within an aperture 615 defined by an enclosure 620. The keycap 605 may include a first magnetic component 625. However, in this particular embodiment, the first magnetic component 625 may extend along an entire bottom surface of the keycap 605.

The input mechanism 600 may also include a compliant member 630, a second magnetic component 635, and a coil 640 adjacent the second magnetic component 635. The input mechanism 600 may also include a drive circuit 650 coupled to a circuit board 645, a sensor 655 and one or more switches 660. Each of these components may function in a similar manner as described above.

FIGS. 7A-7C illustrate various force displacement curves that may characterize force responses of the various input mechanisms described above. In the described embodiments, the input mechanism may be tuned to provide a specific force response, such as the force response characterized by the force displacement curve 700 shown in FIG. 7A. Furthermore, the input mechanism may be configurable to exhibit different force responses at different times or under different conditions by changing the magnetic force between magnetic components in the input mechanism. The magnetic forces between the magnetic components may be static or fixed for a desired force response, or they may dynamically change over the travel distance of the input mechanism.

FIG. 7A illustrates a first example force displacement curve 700. More specifically, the force displacement curve 700 simulates a typical dome switch in a key, and thus may resemble a standard mechanically actuated key. In this implementation, an actuation force causes an input surface of the input mechanism to move. As the input surface moves, a first magnetic component coupled to the input surface approaches a second magnetic component. In some embodiments, the second magnetic component may exert a repulsive magnetic force on the first magnetic component. Here, the magnets' strength may vary with the input surface's travel in order to increase the resistive force of the input structure, but have the increase in resistive force decrease with displacement in region A. Put another way, in region A the resistive force increases, but the rate of increase decreases.

Accordingly, the force response (e.g., the force imparted by the input mechanism in an opposition direction to the actuation force) of the input mechanism may increase (represented in the force displacement curve 700 as the initial upslope of the curve) until an inflection point 705 is reached. The inflection point 705 may correspond to a peak force required to translate the input mechanism during actuation and/or prior to the input mechanism reaching or approaching its travel limit, actuation travel, or the like.

In some embodiments, the second magnetic component may exert a repulsive magnetic force on the first magnetic component up until the inflection point 705 is reached (represented as region A in the force displacement curve 700). Once the inflection point 705 is reached, the magnetic force exerted by the second magnetic component on the first magnetic component is reduced or otherwise changed such that the repulsive force between the magnetic components decreases. In some embodiments, the change or decrease in the repulsive force is caused by passing a current through a coil that surrounds or is otherwise associated with the second magnetic such as described above. Thus, the force required to translate the input mechanism decreases. At the inflection point 705, the user may experience a haptic output similar to that of a mechanical dome collapsing in a typical mechanically actuated key (e.g., a "click" feeling)

After the inflection point 705, the magnetic force between the first magnetic component and the second magnetic component may change until it reaches an operating point 710. As briefly described above, the change in the magnetic force may be a decrease in a repulsive magnetic force between the magnetic components. Alternately, the change in the magnetic force may equate to changing the repulsive magnetic force to an attractive magnetic force. The change in the magnetic force may occur in region B of the force displacement curve 700.

The operating point 710 may be at or near a maximum travel distance of the input mechanism. In other embodiments, the operating point 710 may be a point at which the magnetic force exerted by the second magnetic component on the first magnetic component restricts movement of the input mechanism, thereby signaling actuation of the input mechanism (and, optionally, generating an input signal). After the input mechanism reaches the maximum travel distance, the force required to move the input mechanism increases asymptotically. This is region C in the force displacement curve 700.

FIG. 7B illustrates a second example force displacement curve 720. Like the force displacement curve described above, the force response of the input mechanism may increase until an inflection point 725 is reached. In this embodiment, the second magnetic component may exert a repulsive magnetic force on the first magnetic component (represented as region A in the force displacement curve 720). At this point, the user may experience a haptic output corresponding to a click. In this embodiment, the magnetic strength of both magnets is constant in region A, such that the rate of increase of the resistive force also increases with displacement.

Once this point is reached, the magnetic force exerted by the second magnetic component on the first magnetic component may be reduced or otherwise changed such as described above. This is represented as region B in the force displacement curve 720.

Once operating point 730 is reached, the magnetic force exerted on the first magnetic component may change again. For example, the second magnetic component may again exert the original (or a different) repulsive magnetic force on the first magnetic component (represented as region C in the force displacement curve 720). The repulsive magnetic force may slow, restrict or otherwise stop the travel of the input mechanism indicating the actuation travel has been achieved (represented as region D in the force displacement curve 720).

In some embodiments, the actuation travel limit may be different from the physical travel limit of the input mechanism. For example, changing the repulsive magnetic force exhibited by the second magnetic component on the first magnetic component, such as described above, may prevent the input mechanism from traveling farther even if physical space between the components of the input mechanism exists.

In some embodiments, the distance between the inflection point 725 and the operating point 730 and/or the rate of the decrease of the curve between the two points, causes the haptic output to be more distinct or pronounced. In addition, the actuation travel of the input mechanism may be dynamically adjusted by varying when the change in the magnetic field occurs such as previously described.

FIG. 7C illustrates a third example force displacement curve 740. In this example, a force response of the input mechanism increases and decreases multiple times over the travel distance of the input mechanism. In some embodiments, the various peaks and valleys of the force displacement curve 740 may be the result of alternating or otherwise changing the magnetic force exhibited by the second magnetic component on the first magnetic component such as described above. For example, the force displacement curve 740 may exhibit various peaks and valleys, each of which may provide a haptic output. Accordingly, the input mechanism may exhibit multiple clicks or otherwise provide a vibration sensation to the user instead of a single haptic output or a single click.

Although specific examples have been given, the force displacement curves provided above are not necessarily to scale. However, each of the example force displacement curves may be utilized by a single input mechanism to provide various haptic sensations to a user.

Figure 8:
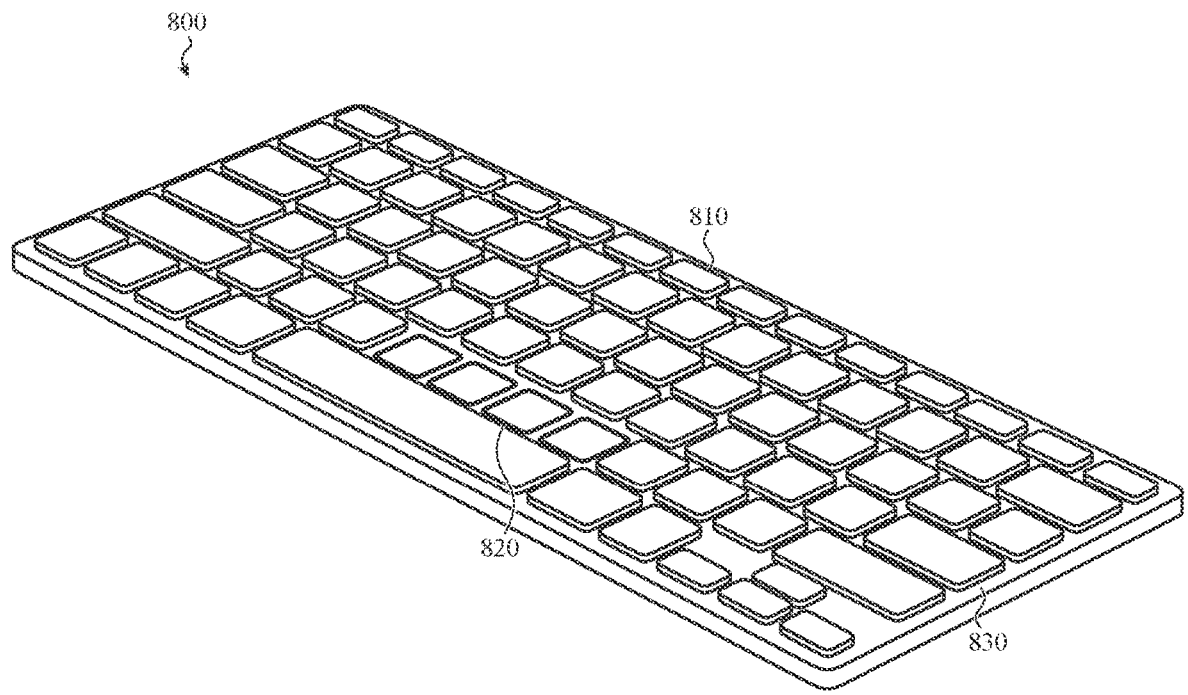
FIG. 8 illustrates an input device having multiple input mechanisms in different positions.

FIG. 8 illustrates an example input device 800 having multiple input mechanisms in different states. In this example, the input device 800 is a keyboard. The keyboard may have multiple keys. Each key may be in a different state. For example, a first set of keys 810 may be in a nominal state such that the input surface of each key extends above a frame 830 or enclosure of the input device 800. Further, the input surfaces of a second set of keys 820 may be flush, substantially flush or recessed with respect to the frame 830 of the input device 800. As discussed above, each of the keys of the input device 800 may use one or more magnetic components to position the keys in either the nominal state or the recessed state.

In some embodiments, the input device 800 may provide haptic output to assist individuals as they use the input device 800. In one implementation, if the user is typing a word and has entered a certain letter combination, haptic output may be provided on one or more keys that may be used to complete the word. For example, if a user has input the letters "appl" on the input device 800, the key with the letter "e" may vibrate to suggest that the user is going to input "apple." Likewise, the key with the letter "i" may also vibrate to suggest that the user is going to type the word "application." Although specific examples have been given, other combinations are contemplated.

As one additional example, individual keys 810 may be raised and/or lowered to create a user-customizable keyboard. The height of keys (and of individual keys) may be set by a user, by an application, by an associated electronic device, and so on. Further, individual keys 810 may have varying heights; some keys may be retracted, some may be fully extended, and some may be at any height in between. In addition to the predictive typing discussed above, other functionality may be generated through such customizability. For example, a home row of keys (such as those representing the initial positions of a touch typist's fingers) may be raised with respect to other keys. Further, this home row may be raised (or lowered) only initially; once an input is provided by depressing any key, the raised (or lowered) keys may return to a default height. The same is true for any function that raises or lowers one or more keys.

In other examples, the input device 800 may lower or raise one or more of its keys in response to user input. For example, if the user has input the characters "appl," the keys that are associated with the characters "i" and "e" may be maintained in their nominal position (like the first set of keys 810 or may be raised) while all other keys are moved to a second position (like the second set of keys 820).

In some embodiments, and continuing with the keyboard example, locator keys (e.g., the "f" and "j" keys that typically have nubs on the input surface to indicate where index fingers typically rest) or home keys may be raised above other keys on the keyboard. Thus, a user may be able to quickly identify particular keys on the keyboard as well as quickly identifying proper placement of the user's hands on the keyboard.

In yet another example, keys of the input device 800 that are typically actuated by different fingers may have different force to click ratios. For example, keys that are typically actuated by index fingers may require a first magnitude of force to be actuated while keys that are typically actuated by the pinkie fingers may require a second magnitude of force to be actuated.

In yet other examples, key of the input device 800 may all simultaneously retract to reduce a height of the keyboard. This may be useful when storing the keyboard or when the keyboard is incorporated into another electronic device. For example, in portable electronic devices thickness is generally sought to be reduced and/or minimized; by retracting the keys, the overall thickness of the electronic device may be reduced when it is not operating.

In other scenarios, a force required to actuate an input mechanism of an input device may be changed based on an application that receives input from the input device or is otherwise running on an electronic device. For example, if a gaming application is running on an electronic device, the input device may use a first travel profile. The first travel profile may have a first travel distance and a first force profile (e.g., an amount of force required to actuate the input mechanism) for each input mechanism. However, if a word processing application is running on the electronic device, the input device may use a second travel profile.

Figure 9A:
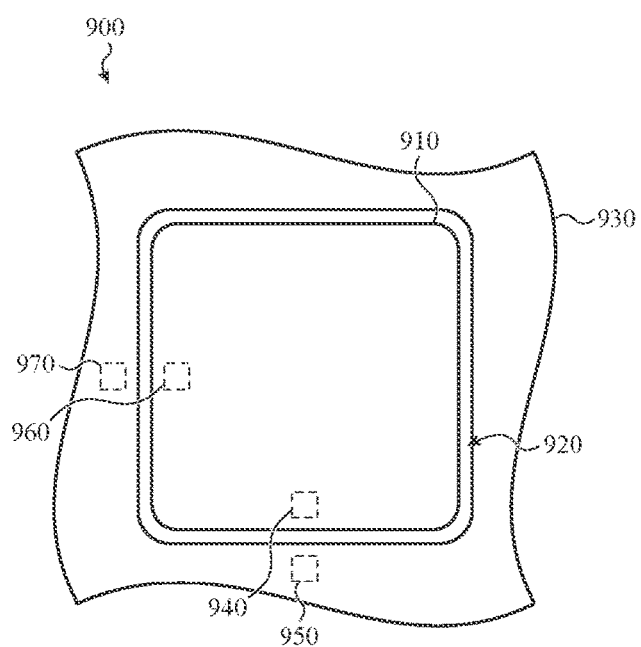
FIG. 9A illustrates a top-down view of an input mechanism in a first position.
Figure 9B:
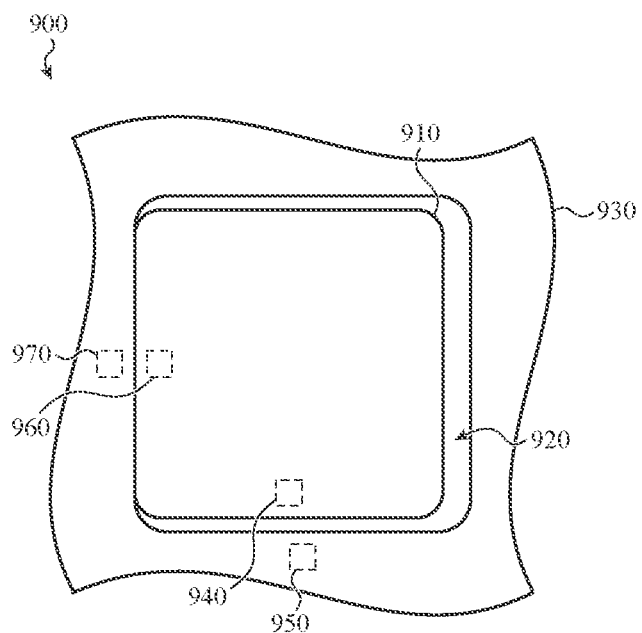
FIG. 9B illustrates a top-down view of the input mechanism of FIG. 9A in a second position.
Figure 9C:
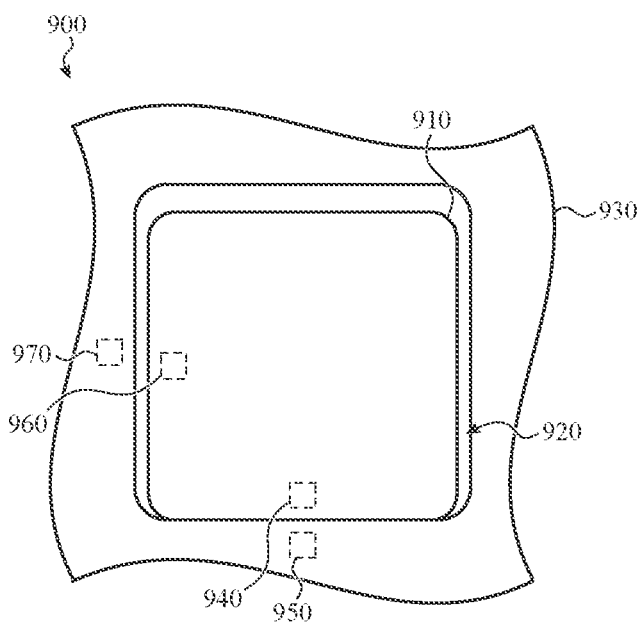
FIG. 9C illustrates a top-down view of the input mechanism of FIG. 9A in a third position.

Although the embodiments described herein have described movement of various input mechanisms in an upward and downward direction to provide haptic output, the various input mechanisms described herein may also move in a variety of directions in order to provide haptic output. For example, FIGS. 9A-9C illustrate movement of an input mechanism 900 in a variety of directions due to varying attractive and/or repulsive magnetic forces between various magnetic components and/or the positioning of various magnetic components within the input mechanism 900. The input mechanism 900 shown in FIGS. 9A-9C may be similar to the input mechanisms described herein.

FIG. 9A is a top-down view of an input mechanism 900 in a first position. The input mechanism 900 may include an input surface, such as, for example, a keycap 910, positioned within an aperture 920 defined by an enclosure 930. The keycap 910 may include a first magnetic component 940 and a second magnetic component 960. A third magnetic component 950 may be positioned adjacent the first magnetic component 940 and a fourth magnetic component 970 may be positioned adjacent the second magnetic component 960.

In order to move the keycap 910 in a first direction within the aperture 920, such as shown in FIG. 9B, an attractive magnetic force between the fourth magnetic component 970 and the second magnetic component 960 may increase in a similar manner as described above. In some embodiments, a repulsive magnetic force between the third magnetic component 950 and the first magnetic component 940 may also increase to assist with the movement of the keycap 910 within the aperture 920. As the keycap 910 moves, haptic output may be provided to the user.

In order to move the keycap 910 in a second direction within the aperture 920, such as shown in FIG. 9C, an attractive magnetic force between the third magnetic component 950 and the first magnetic component 940 may increase in a similar manner as described above. Likewise, to assist with the movement of the keycap 910 within the aperture 920, a repulsive magnetic force between the fourth magnetic component 970 and the second magnetic component 960 may increase in a similar manner as described above. As the keycap 910 moves in the second direction, a second haptic output may be provided to the user.

In some embodiments, the first magnetic component 940 and the second magnetic component 960 may be contained within the keycap 910 such as described above. In other embodiments, the first magnetic component 940 and the second magnetic component 960 may be positioned at various locations within or on the keycap 910. For example, one or both of the first magnetic component 940 and the second magnetic component 960 may be positioned on a side or a flange of the keycap 910. Likewise, the third magnetic component 950 and the fourth magnetic component 970 may be coupled to the enclosure 930 or otherwise be positioned adjacent the first magnetic component 940 and the second magnetic component 960.

In other embodiments, the first magnetic component 940 may be positioned within the underside of the keycap 910, and the second magnetic component 960 may be positioned on a flange or a sidewall of the keycap 910. Although specific examples have been given, the positioning of the various magnetic components, as well as the number of magnetic components, may vary.

Figure 10A:
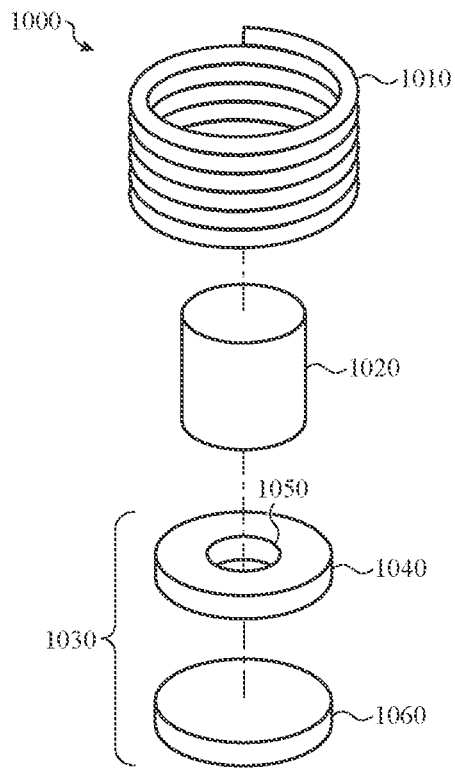
FIG. 10A illustrates an exploded view of various components of an example electromechanical system that can be used in with the various input mechanisms described herein.

FIG. 10A illustrates an exploded view of various components of an electromechanical system 1000 that may be used to produce a haptic output and/or movement in various devices. For example, in some implementations, the electromechanical system may be used in the various input mechanisms described above. In other implementations, the components of the electromechanical system 1000 may be arranged in various other configurations to provide additional functionality. These include, but are not limited to, cores of loudspeaker drivers, cores of servomechanisms, cores of pulsed relays, shock absorbers, linear or circular actuators and so on. These and other examples will be explained in greater detail below.

The electromechanical system 1000 described herein may be implemented without the use of permanent magnets or other rare earth elements. Accordingly, the overall cost of the components in which the electromechanical system 1000 is implemented, and the cost of the electromechanical system 1000 itself, may be reduced.

The electromechanical system 1000 includes a coil 1010. The coil 1010 may be made of any conductive material such as silver, copper, gold and so on. The coil 1010 may have any number of turns or rings. The coil 1010 may be wrapped around or otherwise be associated with a core 1020 that acts to increase or enhance a magnetic field generated by the coil 1010. The core 1020 may be made of a ferromagnetic material such as, steel, iron, iron-cobalt, nickel and so on. Although FIG. 10A shows the core 1020 being associated within the coil 1010, in some implementations, the core 1020 may be omitted.

The electromechanical system 1000 may also include bimetallic plate 1030 or disk. The bimetallic plate 1030 includes a first layer 1040 of a conductive material (e.g., copper) and a second layer 1060 of a ferromagnetic material (e.g., steel, iron-cobalt etc.). The second layer 1060 may be coupled to the first layer 1040 using an adhesive, a clip, or other securement mechanism. The second layer 1060 is positioned behind the first layer 1040 such that the first layer 1040 is nearer the coil 1010. Although plate 1030 is shown, other geometric shapes may be used. For example, the plate 1030 may be shaped as a box, a sphere, a rectangle and so on. In such embodiments, the first layer 1040 may partially or entirely cover the second layer 1060. For example, if the a sphere is used, the outer layer of the sphere may be made of a conductive material while the inner layer of the sphere is a ferromagnetic material.

Figure 10B:
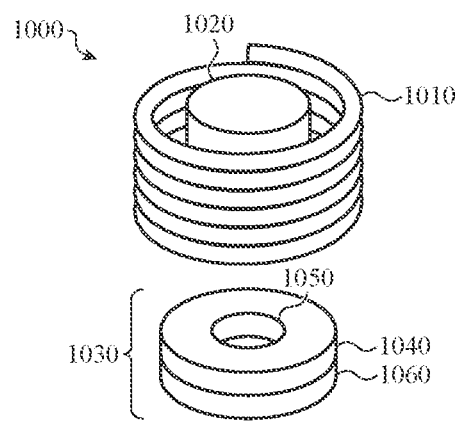
FIG. 10B illustrates the assembled electromechanical system of FIG. 10A.

The first layer 1040 may include an aperture 1050 or other opening. The aperture 1050 defines a current path for an electromagnetic field produced by the coil 1010 when a current is applied to it. More specifically, when the electromechanical system 1000 is in an assembled state such as shown in FIG. 10B, the bimetallic plate 1030 may be placed a distance away from the coil 1010 and the core 1020. When the coil 1010 is energized such as, for example, by an electrical circuit, the bimetallic plate 1030 is either repelled from, or attracted to, the coil 1010. Movement of the bimetallic plate 1030 may be used for a variety of purposes including providing haptic output, moving an input mechanism from a first position to a second position and so on.

In some embodiments, the coil 1010 may be energized by different pulses or a series of pulses which cause the bimetallic plate 1030 to act in certain ways. For example, if a short pulse (or series of short pulses) with a short rise time is applied to the coil 1010, eddy currents will be produced in the first layer 1040 of the bimetallic plate 1030. The eddy currents in the first layer 1040 will produce a magnetic field that opposes the magnetic field generated by the coil 1010. As a result, the bimetallic plate 1030 will be repelled from the coil 1010. As discussed above, the aperture 1050 in the first layer 1040 may enhance the effects of the eddy currents.

In some embodiments, the short pulse may have a rise time of approximately 2-3 µs and a width of approximately 10 µs although other values may be used. The short pulse may be a positive voltage or a negative voltage.

In other embodiments, the pulse applied to the coil 1010 may be a full cycle pulse containing both positive and negative voltages. In such embodiments, the coil 1010 will produce two consecutive repulsive forces. Depending on the timing between the pulses, the repulsive forces may build on one another. As such, various pulses may be repeated until a desired momentum and velocity of the bimetallic plate 1030 is reached.

In addition to creating repulsive forces, the first layer 1040 may also act as a shield for the second layer 1060. For example, when short pulses are applied to the coil 1010, the first layer 1040 effectively blocks the magnetic field originating from the coil 1010 and prevents the magnetic field from reaching or otherwise affecting the second layer 1060.

In addition to producing repulsive forces that cause the bimetallic plate 1030 to move away from the coil 1010, the electromechanical system 1000 may also be used to produce attractive forces on the bimetallic plate 1030. The attractive forces are caused by one or more long pulses with a long rise time being applied to the coil 1010. In some embodiments, the rise time of the long pulse may be approximately 1 ms or more and the pulse length may also be approximately 1 ms or more although other values may be used.

A long pulse will not produce significant eddy currents in the first layer 1040 of the bimetallic plate 1030. In some situations, the first layer 1040 may be transparent or substantially transparent to the pulse. As a result, the bimetallic plate 1030 will not be repelled from the coil 1010. However, the second layer 1060 of the bimetallic plate 1030 may absorb the magnetic flux originating from the coil 1010. As a result, the second layer 1060 will be attracted to the coil 1010 and will move toward it. As with the short pulse, the long pulse can be a negative voltage, a positive voltage, or a full cycle pulse. The long pulse can also be repeated until a desired momentum and velocity of the bimetallic plate 1030 is reached.

In some embodiments, short pulses and long pulses may be combined in any number of ways to produce a desired movement of the bimetallic plate 1030. For example, a short pulse and a series of long pulses may be provided to the coil 1010 to cause the bimetallic plate 1030 to move away from the coil 1010 and subsequently be attracted to the coil 1010. Likewise, a long pulse may be followed by a short pulse to cause the bimetallic plate 1030 to move toward the coil 1010 and subsequently move away from the coil 1010. Likewise, the pulses may have various shapes. For example, the pulses may be square waves, sawtooth waves, or other non-linear waves.

In some embodiments, the first layer 1040 and the second layer 1060 may have different masses or the same masses. The masses may affect the momentum and velocity of the bimetallic plate 1030. As such, different masses may be used in different implementations.

Figure 11:
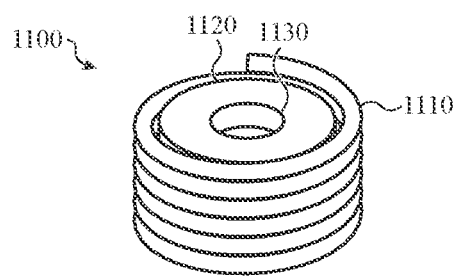
FIG. 11 illustrates a second example arrangement of various components of an electromechanical system.

FIG. 11 illustrates another example arrangement of components of an electromagnetic system 1100. In this particular implementation, the electromagnetic system 1100 includes a coil 1110 and a plate 1120 contained within the coil 1110. The coil 1110 may be similar to the coil 1010 described above and the plate 1120 may be similar to the bimetallic plate 1030 described above. In another embodiment, the plate 1120 may be similar to the first layer 1040 of the bimetallic plate 1030 only.

When various pluses (e.g., short pulses or long pulses) are applied to the coil 1110, the plate 1120 may move away from and/or outside of the coil 1110 as the pulse may cause the coil 1110 to generate repulsive forces on the coil 1110. In cases where the plate 1120 includes a ferromagnetic material, a long pulse applied to the coil 1110 may cause the plate 1120 to be attracted to the coil 1110 such as described above.

Figure 12:
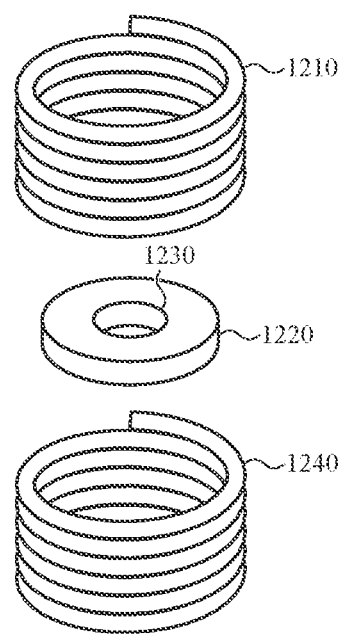
FIG. 12 illustrates a third example arrangement of various components of an electromechanical system.

FIG. 12 illustrates another example arrangement of components of an electromagnetic system 1200. In this embodiment, the electromagnetic system 1200 includes a first coil 1210, a second coil 1240 and a plate 1220. The plate 1220 may be made of a conductive material (e.g., copper). An aperture 1230 may also be included in the plate 1220 and function in a similar manner as described above.

In this embodiment, the plate 1220 may be placed between the first coil 1210 and the second coil 1240. The plate 1220 may move depending on which coil is activated. For example, if the first coil 1210 generates a first magnetic field, the plate 1220 will move away from the first coil 1210 toward the second coil 1240. Likewise, if the second coil 1240 generates a second magnetic field, the plate 1220 will move away from the second coil 1240 and toward the first coil 1210.

In some implementations, the first coil 1210 and the second coil 1240 may be activated simultaneously or substantially simultaneously. For example a first pulse having a first rise time and a first width may be applied to the first coil 1210 and a second pulse having a second rise time and a second width may be applied to the second coil 1240 at the same time or substantially the same time. In some embodiments, the second pulse may be used to offset the movement of the plate 1220 caused by the first pulse. In another embodiment, the first coil 1210 may be configured to receive a positive voltage of a single pulse and the second coil 1240 may be configured to get a negative voltage of the single pulse.

Using all of the above examples, the movement of the plate 1220 (including the bimetallic plate 1030 and the plate 1130) may be precise or otherwise tuned to move a desired distance at a particular frequency. As such, the electromechanical systems described above may be implemented as an analog speaker, the core of a speaker driver and so on.

In another example, the first coil 1210 and the second coil 1240 may be activated simultaneously with the same or a similar pulse which causes the plate 1220 to maintain its position. In this example, the electromagnetic system 1200 may function as a core of a servomechanism.

Figure 13:
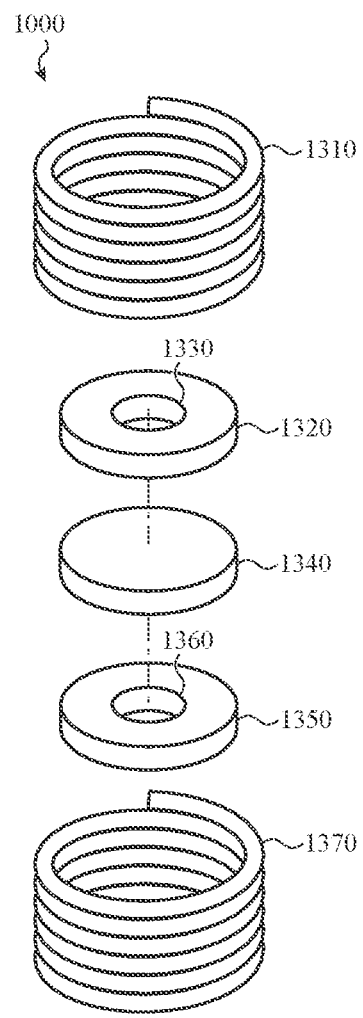
FIG. 13 illustrates an exploded view of a fourth example arrangement of various components of an electromechanical system.

FIG. 13 illustrates an exploded view of another arrangement of components of an electromechanical system 1300. In this implementations, the electromechanical system 1300 includes a first coil 1310, a first layer 1320 having an aperture 1330, a second layer 1340, a third layer 1350 having an aperture 1360, and a second coil 1370.

The first coil 1310 and the second coil 1370 function in a similar way to the coil 1010 described above. Likewise, the first layer 1320 and the third layer 1350 may be similar to the first layer 1040 of FIG. 10A and the second layer 1340 may be similar to the second layer 1060 of FIG. 10A. Each of the first layer 1320, the second layer 1340 and the third layer 1350 may be coupled together to form a single plate.

As pulses are applied to the first coil 1310 and the second coil 1370, the plate may move in a particular manner. More specifically, firing opposing and/or complimentary short pulses and long pulses on each of the first coil 1310 and the second coil 1370 may double the forces on the plate.

In each of the examples above, the electromechanical system, and more specifically, the plates of each electromechanical system can be moved in a variety of ways and for a variety of purposes. For example, the plates can be used in various servomechanisms or the plate can move in a manner that drives a piston or other oscillatory mechanism. The electromechanical system, and more specifically the movement of the plate can act as an ultrasonic welder. The plate may also be configured to vibrate in such a manner that it acts as a core of a speaker. In another embodiment, a toggle mechanism may be added to the one or more of the examples set forth above and the electromechanical system may be a core or other component of a pulsed relay. In another example, a plate of the electromechanical system may be configured to respond to an external force with a hard or soft reaction which causes the electromechanical system to act as a shock absorber.

Although specific examples are given, the electromechanical systems described herein may be used in a variety of situations and for a variety of functions. As discussed above, a variety of different pulses may be provided to the coils of the electromechanical systems in order to cause them to behave in such a manner.

Figure 14:
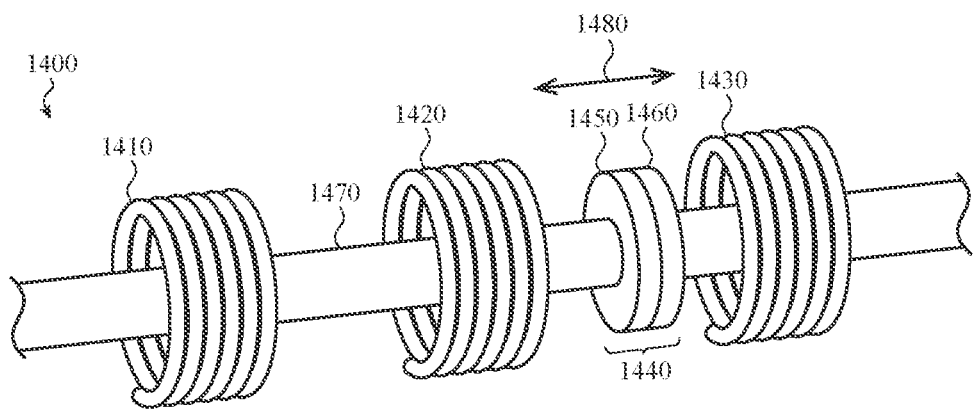
FIG. 14 illustrates fifth example arrangement of various components of an electromechanical system.

FIG. 14 illustrates another arrangement of components of an electromechanical system 1400. In this example, the electromechanical system 1400 includes any number of coils labeled in FIG. 14 as 1410, 1320 and 1430. Although three coils are shown, fewer or more coils may be used.

The electromechanical system also includes a plate 1440 moveably coupled to a shaft 1470. The plate 1440 may include a first layer 1450 and a second layer 1460. For example, the first layer 1450 may be a conductive material similar to the first layer 1040 described above and the second layer 1460 may be made of a ferromagnetic material similar to the second layer 1060.

As various pulses are applied to each of the coils, the plate 1440 may move along the shaft in the direction of the arrow 1480. In one specific implementation, the electromechanical system 1400 shown in FIG. 14 may function as a linear actuator or a circular actuator.

For example, if a short pulse is applied to the second coil 1420, a repulsive force between the plate 1440 and the second coil 1420 will cause the plate 1440 to move toward the third coil 1430. Likewise, if a short pulse is applied to the coil 1430, the plate 1440 will move along the shaft 1470 toward the second coil 1420 and the first coil 1410. In this particular embodiment, the electromechanical system 1400 may act as a linear actuator to provide haptic output.

Although the plate 1440 and the coils 1410, 1420, and 1430 are shown in a linear configuration, other arrangements are possible. For example, each of the coils may be arranged in a three dimensional pattern. In such embodiments, the plate 1440 may move in a three dimensional space defined by the position of the coils. Further, although a plate is described in each of the embodiments described above, other shapes may be used. For example, the electromechanical systems described herein may use or incorporate boxes, spheres or other geometric shapes in lieu or in addition to the various plates described above. In such embodiments the sphere or box may have an outer layer formed of a conductive material and an inner layer formed from a ferromagnetic material. In addition, other components such as springs, slides, switches and the like may be added to the electromechanical systems described herein.

Figure 15:
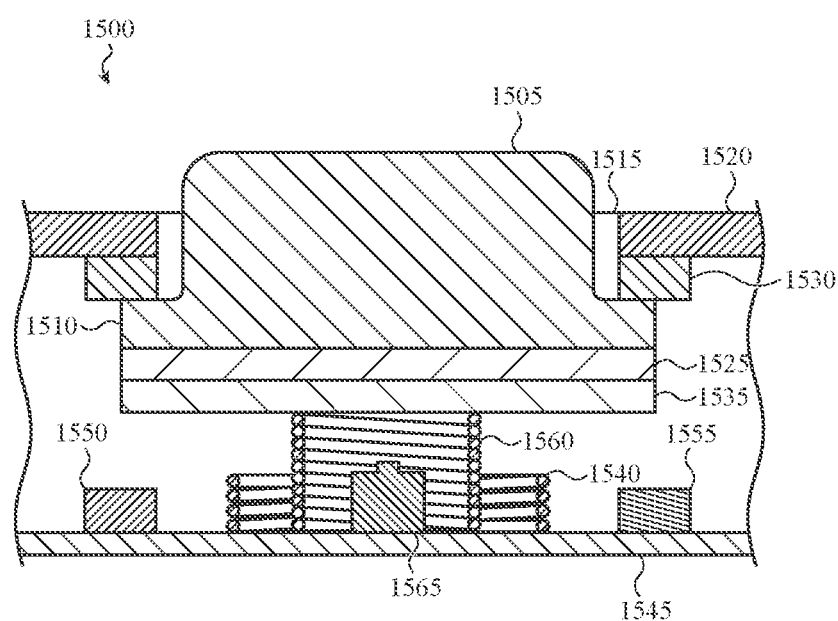
FIG. 15 illustrates a sample cross-section view of an input mechanism of the adjustable input device according to a sixth embodiment.

FIG. 15 shows a cross-section view of an input mechanism 1500 of an input device according that may use or otherwise incorporate an electromechanical system such as described above. The cross-section view of the input mechanism 1500 may be taken along line A-A of FIG. 1. Like the input mechanisms described above, the input mechanism 1500 may include an input surface, such as, for example, a keycap 1505. The keycap 1505 may include a flange 1510. The keycap 1505 may also be positioned within an aperture 1515 defined by an enclosure 1520.

The input mechanism 1500 also includes a compliant member 1530, a first layer 1535 and a second layer 1525. The first layer 1535 and the second layer 1525 may be coupled to or otherwise associated with the keycap 1505. The first layer 1535 is made of a conductive material (e.g., copper) and the second layer 1525 may be made of a ferromagnetic material (e.g., steel, iron-cobalt etc.). The input mechanism 1500 also includes a coil 1540. The coil 1540 may be made of any conductive material such as silver, copper, gold and so on. The coil 1540, the first layer 1535 and the second layer 1525 may function in a similar manner to the coil 1010, the first layer 1040 and the second layer 1060 of the electromechanical system 1000 described above with respect to FIG. 10A.

For example, depending on the pulse that is applied to the coil 1540 by a drive circuit 1550, the first layer 1535 may be repelled by the coil 1540 or the second layer 1525 may be attracted to the coil 1540. As the various layers are either repelled from or attracted to the coil 1540, the keycap 1505 moves from a first position to a second position. In some embodiments, the coil 1540, the first layer 1535 and the second layer 1525 may provide a haptic output that simulates a click sensation as the keycap 1505 moves such as described above.

The input mechanisms 1500 may also include a sensor 1555 and one or more switches 1565 coupled to a circuit board 1545. Each of these components may function in a similar manner as described above. For example, the sensor 1555 may be used to determine a position of the keycap 1505 and more specifically a position of the first layer 1535 and the second layer 1525.

The input mechanisms 1500 may also include a spring 1560. The spring 1560 may function to keep the keycap 1505 in its nominal position. The spring 1560 may also enable the keycap to be actuated in response to a received force and also cause the keycap 1505 to return to its nominal position when the force is removed.

As with prior embodiments, the input mechanisms 1500 may be retractable, collapsible, or the like. For example, the input mechanisms 1500 may be configured such that top surfaces of the keycaps 1505 are flush with a housing of an electronic device when the input mechanisms are not in use. Generally, a force gradient of the coil 1540, when activated, is much greater than a force gradient of the spring 1560. At relatively larges distances between the coil 1540 and the first and second layers 1535, 1525, the spring exerts more force on the layers and keycap 1505 than does a transient signal through the coil (or no signal). This biases the keycap upward, to the position shown in FIG. 15.

The input mechanism 1500 may be retracted, for example such that a top surface of the keycap 1505 is flush (or near-flush) with a top surface of the enclosure 1520, by activating the coil with a relatively strong and sustained electrical signal. This energizes the coil 1540, thereby generating an attraction force that draws the second layer 1525 toward it. This attractive magnetic force may overcome the biasing force of the spring. Accordingly, the keycap 1505 and first layer 1535 likewise move toward the coil. Generally, the stronger a sustained electrical current through the coil is, the greater the magnetic field produced and the stronger the attractive force exerted on the second layer is. By generating a sufficiently strong attractive magnetic force, the keycap 1505 may be drawn downward and held in a retracted/collapsed position.

Figure 16:
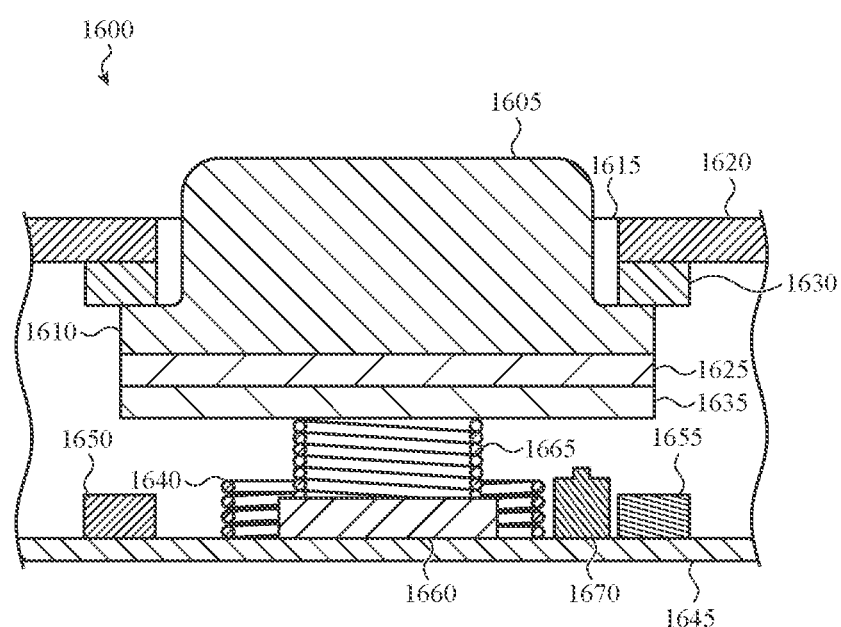
FIG. 16 illustrates a sample cross-section view of an input mechanism of the adjustable input device according to a seventh embodiment.

FIG. 16 shows a cross-section view of another input mechanism 1600 of an input device that may use or otherwise incorporate an electromechanical system such as described above. The cross-section view of the input mechanism 1600 may be taken along line A-A of FIG. 1. Like the input mechanisms described above, the input mechanism 1600 may include a keycap 1605 having a flange 1610 and positioned within an aperture 1615 defined by an enclosure 1620.

The input mechanism 1600 also includes a compliant member 1630 coupled to the enclosure 1620, and a first layer 1635 and a second layer 1625 positioned underneath or otherwise coupled to the keycap 1605. The first layer 1535 is made of a conductive material (e.g., copper) and the second layer 1525 may be made of a ferromagnetic material (e.g., steel, iron-cobalt etc.). The input mechanism 1600 also includes a coil 1640. The coil 1640 may be made of any conductive material such as described above. The coil 1640, the first layer 1635 and the second layer 1625 may function in a similar manner to the coil 1010, the first layer 1040 and the second layer 1060 of the electromechanical system 1000 described above.

The input mechanism 1600 may also include a drive circuit 1650 that provides one or more pulses to the coil 1640. The drive circuit 1650 is coupled to a circuit board 1545. A sensor 1655 and one or more switches 1670 may also be included. Each of these components may function in a similar manner as described above. In addition, the input mechanism 1600 may also include a spring 1665. The spring 1665 may function in a similar manner to the spring 1560 described above.

In addition to these components, the input mechanism 1600 may also include a core 1660 within the coil 1640. The core 1660 may be a magnet or other material and function to increase the repulsive or attractive force provided by the coil 1640 on the first layer 1635 and the second layer 1625 of the input mechanism 1600. In addition, the core 1660, when magnetized, may hold the keycap 1605 in a depressed position once the input mechanism 1600 has been actuated.

Figure 17:
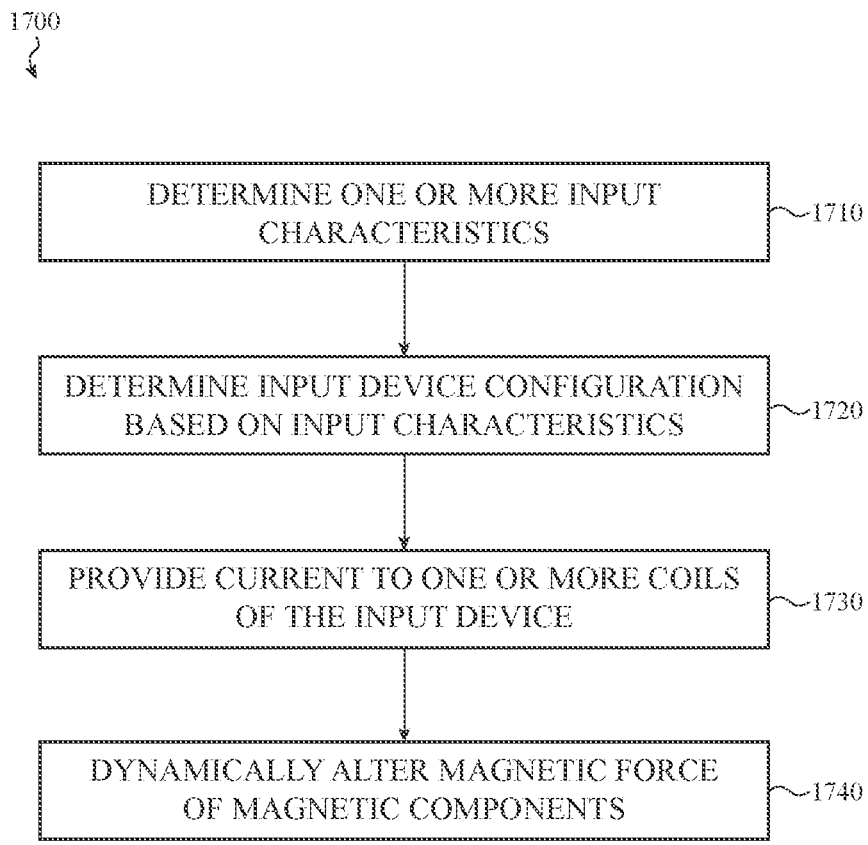
FIG. 17 illustrates a method for adjusting one or more input mechanisms of an adjustable input device.

FIG. 17 illustrates a method 1700 for adjusting a travel profile one or more input mechanisms of an input device. For example, the method 1700 may be used to dynamically adjust an operating force, a force to click ratio, and a travel of the various input mechanisms described herein.

Method 1700 begins at operation 1710 in which one or more input characteristics of a user are determined. The input characteristics may be determined by one or more sensors provided in the input device. In some embodiments, the input characteristics may be determined by other components of the input device. For example, a processor associated with the input device may determine the speed of input based on the rate at which a switch associated with each input mechanism is actuated. In other embodiments, a user may manually enter or otherwise provide the input characteristics.

As described above, the input characteristics may include a hand or finger size of the user, a magnitude of force applied to the various input mechanisms, the speed of input, gender, and so on.

Once the input characteristics are determined, flow proceeds to operation 1720 and a configuration of the input device is determined. In some embodiments, the configuration of the input device is based, at least in part, on the input characteristics.

The configuration of the input device may be selected based on a predefined set of input characteristics. For example, a user with a first set of input characteristics may be assigned a first predefined input device configuration while a user with a second set of input characteristics may be assigned a second, different predefined input device configuration.

In other embodiments, the configuration of the input device may be selected using only the detected input characteristics. For example, if the sensor of the input mechanism determines that the user provides a high magnitude of force when typing, the resistance between the magnetic components may increase. Likewise, if the sensor of the input mechanism determines that the user provides a low magnitude of force when typing, the resistance between the magnetic components may decrease.

Flow then proceeds to operation 1730 in which a current is provided to one or more coils of the input device. As described above, each input mechanism of the input device may have a coil associated with a magnetic component. The coil may receive a current that enhances, weakens or otherwise changes the magnetic properties of the magnetic component. The change in the magnetic properties, which effectively changes the magnetic force between the magnetic components, may be based, at least in part, on the input characteristics.

Once the coil receives the current, the magnetic force between the magnetic components dynamically changes 1740. In some embodiments, the adjustment may occur in real-time or substantially real-time such as, for example, while the user is providing input. In other embodiments, the adjustments may be made after the input has been provided. Regardless of when the adjustments are made, the input device may continually adjust its configuration based on received input over time. As such, multiple users may use a single input device, and the input device may adjust its configuration based on the current user's input characteristics.

Figure 18:
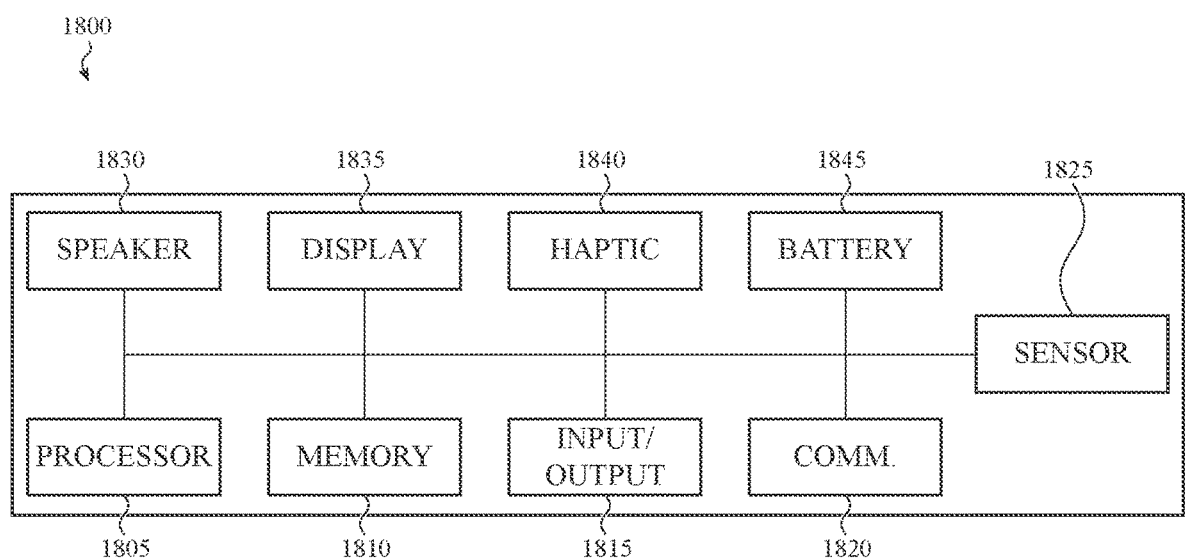
FIG. 18 illustrates example components of an electronic device that may use or incorporate an adjustable input device such as described herein.

FIG. 18 illustrates example components of an electronic device 1800 that may use or incorporate an adjustable input device such as described above. As shown in FIG. 18, the electronic device 1800 includes at least one processor 1805 or processing unit configured to access a memory 1810. The memory 1810 may have various instructions, computer programs, or other data stored thereon. The instructions may be configured to perform one or more of the operations or functions described with respect to the electronic device 1800. For example, the instructions may be configured to control or coordinate the operation of the display 1835, one or more input/output components 1815, actuation of the drive circuit such as described above, one or more communication channels 1820, one or more sensors 1825, a speaker 1830, and/or one or more haptic actuators 1840.

The processor 1805 may be implemented as any electronic device capable of processing, receiving, or transmitting data or instructions. For example, the processor 1805 can be a microprocessor, a central processing unit (CPU), an application-specific integrated circuit (ASIC), a digital signal processor (DSP), or combinations of such devices.

The memory 1810 can store electronic data that can be used by the electronic device 1800. For example, the memory 1810 can store electrical data or content such as, for example, audio and video files, documents and applications, device settings and user preferences, timing and control signals or data for the various modules, data structures or databases, and so on. The memory 1810 may also store the predefined input device configurations or settings that are based on various input characteristics.

The memory 1810 may be any type of memory such as, for example, random access memory, read-only memory, Flash memory, removable memory, or other types of storage elements, or combinations of such devices.

The electronic device 1800 may include various input and output components represented in FIG. 18 as Input/Output 1815. Although the input and output components are represented as a single item, the electronic device 1800 may include a number of different input components, including buttons, input surfaces, microphones, switches, rotatable crowns, dials and other input mechanisms for accepting user input. The input and output components may include one or more touch sensors and/or force sensors. For example, the display 1835 may be comprised of a display stack that includes one or more touch sensors and/or one or more force sensors that enable a user to provide input to the electronic device 1800.

The electronic device 1800 may also include one or more communication channels 1820. These communication channels 1820 may include one or more wireless interfaces that provide communications between the processor 1805 and an external device or other electronic device. In general, the one or more communication channels 1820 may be configured to transmit and receive data and/or signals that may be interpreted by instructions executed on the processor 1805. In some cases, the external device is part of an external communication network that is configured to exchange data with other devices. Generally, the wireless interface may include, without limitation, radio frequency, optical, acoustic, and/or magnetic signals and may be configured to operate over a wireless interface or protocol. Example wireless interfaces include radio frequency cellular interfaces, fiber optic interfaces, acoustic interfaces, Bluetooth interfaces, Near Field Communication interfaces, infrared interfaces, USB interfaces, Wi-Fi interfaces, TCP/IP interfaces, network communications interfaces, or any conventional communication interfaces.

The electronic device 1800 may also include one or more sensors 1825. Although a single representation of a sensor 1825 is shown in FIG. 18, the electronic device 1800 may have many sensors. These sensors may include resistive sensors, light sensors, capacitive sensors, biometric sensors, temperature sensors, accelerometers, gyroscopes, barometric sensors, moisture sensors, and so on. The sensors may also include optical sensors, magnetic sensors, Hall effect sensors, Anisotropic Magneto-Resistive sensors, tunnel magnetoresistance sensors, and so on.

One or more acoustic modules or speakers 1830 may also be included in the electronic device 1800. The speaker 1830 may be configured to produce an audible sound or an acoustic signal.

As also shown in FIG. 18, the electronic device 1800 may include one or more haptic actuators 1840. The haptic actuators 1840 may be any type of haptic actuator including rotational haptic devices, linear haptic actuators, piezoelectric devices, vibration elements, and so on. The haptic actuator 1840 is configured to provide punctuated and distinct feedback to a user of the electronic device 1800. In some embodiments, the haptic actuator 1840 may work in conjunction with the magnetic components to provide further distinctive haptic or tactile output. For example, the haptic actuator 1840 may be actuated at or near the same time that the repulsion or attraction between the magnetic components changes or is otherwise altered. As a result, the strength or perceptibility of the haptic output may be increased.

The electronic device 1800 may also include an internal battery 1845. The internal battery 1845 may be used to store and provide power to the various components and modules of the electronic device 1800 including the haptic actuator 1840. The battery 1845 may be configured to charge using a wireless charging system although a wired charging system may also be used.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A key mechanism, comprising:
   an input mechanism operative to move from a first position to a second position in response to a received input, the input mechanism including a sensor or switch, the sensor or switch being configured to initiate an input signal in response to movement of the input mechanism to the second position, the input mechanism comprising a keycap;
   a first magnetic component coupled to the keycap;
   a second magnetic component spaced apart from the first magnetic component and spaced apart from the keycap, wherein a magnetic force between the first and second magnetic components is adjustable;
   a third magnetic component coupled to the keycap;
   a fourth magnetic component spaced apart from the third magnetic component and spaced apart from the keycap, wherein a magnetic force between the third and fourth magnetic components is adjustable; and
   a drive circuit operable to dynamically alter a magnetic property of at least one of the first and second magnetic components and at least one of the third and fourth magnetic components;
   wherein in a first condition of the keycap mechanism, the drive circuit is configured to alter the magnetic property of the at least one of the first and second magnetic components, wherein the second magnetic component interacts with the first magnetic component to produce a first haptic output in response to the received input, the first haptic output comprising a movement of the input mechanism perpendicular to the received input in a first direction; and
   wherein in a second condition of the input device, the drive circuit is configured to alter the magnetic property of the at least one of the third and fourth magnetic components, wherein the fourth magnetic component interacts with the third magnetic component to produce a second haptic output in response to the received input, the second haptic output comprising a movement of the input mechanism perpendicular to the received input in a second direction, the first direction being different from the second direction.

2. The keycap mechanism of claim 1, wherein the keycap is positioned in a keyboard.

3. The keycap mechanism of claim 1, further comprising a compliant member positioned between the input mechanism and an enclosure that is adjacent the input mechanism.

4. The keycap mechanism of claim 1, further comprising a fifth magnetic component having an adjustable magnetic force configured to change a travel distance of the input mechanism between the first position and the second position.

5. The keycap mechanism of claim 1, further comprising a second sensor operative to detect an input characteristic associated with the received input, wherein the input characteristic includes at least one of: a magnitude of force applied to the input mechanism, a hand size of a user, a finger size of a user, a hand placement on the input device, a finger placement on the input device, and a speed of input applied to the input mechanism.

6. The keycap mechanism of claim 4, wherein the fifth magnetic component is operative to retract the input mechanism by magnetically attracting the input mechanism from the first position to the second position.

7. The keycap mechanism of claim 4, wherein the fifth magnetic component is operative to repel the input mechanism from the second position to the first position.

8. A key mechanism, comprising:
- a keycap;
- an enclosure defining an aperture in which the keycap is positioned;
- a first magnetic component positioned on the keycap;
- a second magnetic component coupled to the enclosure, wherein at least one of the first magnetic component and the second magnetic component comprises a first electromagnet configured to move the keycap in a first lateral direction within the aperture to provide a first haptic output;
- a third magnetic component positioned on the keycap;
- a fourth magnetic component coupled to the enclosure, wherein at least one of the third magnetic component and the fourth magnetic component comprises a second electromagnet configured to move the keycap in a second lateral direction within the aperture to provide a second haptic output, the second lateral direction being non-parallel to the first lateral direction; and
- a drive circuit operable to dynamically alter a magnetic property of the first electromagnet to provide the first haptic output and operable to dynamically alter a magnetic property of the second electromagnet to provide the second haptic output.

9. The key mechanism of claim 8, wherein the first electromagnet comprises a coil operative to change a magnetic force of the second magnetic component in response to the drive circuit applying a current to the coil.

10. The key mechanism of claim 8, wherein the first electromagnet comprises a coil operative to change a magnetic force of the first magnetic component in response to the drive circuit applying a current to the coil.

11. The key mechanism of claim 8, wherein the second magnetic component is configured to attract the first magnetic component to produce the first haptic output.

12. The key mechanism of claim 8, wherein a height of the input mechanism is dynamically alterable in response to a user preference.

13. The input device of claim 1, wherein in the first condition of the input device, the second magnetic component attracts the first magnetic component and the third magnetic component repels the fourth magnetic component to produce the first haptic output.

14. The input device of claim 1, wherein the input mechanism comprises a keycap, wherein the first magnetic component is positioned in a first side of the keycap, wherein the third magnetic component is positioned in a second side of the keycap, the first and second sides being perpendicular to each other.

15. The input device of claim 1, wherein the first direction is perpendicular to the second direction.

\* \* \* \* \*